United States Patent
Barzegar et al.

(10) Patent No.: US 11,188,843 B2
(45) Date of Patent: Nov. 30, 2021

(54) PROGRAMMABLE UNIVERSAL QUANTUM ANNEALING WITH CO-PLANAR WAVEGUIDE FLUX QUBITS

(71) Applicant: Google LLC, Mountain View, CA (US)

(72) Inventors: Alireza Shabani Barzegar, Los Angeles, CA (US); Pedram Roushan, Goleta, CA (US); Yu Chen, Goleta, CA (US); Hartmut Neven, Malibu, CA (US)

(73) Assignee: Google LLC, Mountain View, CA (US)

( * ) Notice: Subject to any disclaimer, the term of this patent is extended or adjusted under 35 U.S.C. 154(b) by 21 days.

(21) Appl. No.: 16/857,955

(22) Filed: Apr. 24, 2020

(65) Prior Publication Data

US 2020/0250570 A1 Aug. 6, 2020

Related U.S. Application Data

(63) Continuation of application No. 16/062,076, filed as application No. PCT/US2015/065995 on Dec. 16, 2015, now Pat. No. 10,657,455.

(51) Int. Cl.
*H01P 3/00* (2006.01)
*G06N 10/00* (2019.01)
*G01R 33/035* (2006.01)

(52) U.S. Cl.
CPC ......... *G06N 10/00* (2019.01); *G01R 33/0356* (2013.01); *G01R 33/0358* (2013.01); *H01P 3/003* (2013.01)

(58) Field of Classification Search
CPC .................................................. G06N 10/00
See application file for complete search history.

(56) References Cited

U.S. PATENT DOCUMENTS

| 8,111,083 B1 | 2/2012 | Pesetski |
| 9,438,246 B1 | 9/2016 | Naaman |
| 10,949,769 B2 * | 3/2021 | Chen .................. G06F 13/4068 |

(Continued)

FOREIGN PATENT DOCUMENTS

| CN | 101339077 | 1/2009 |
| CN | 101978368 | 2/2011 |

(Continued)

OTHER PUBLICATIONS

KR Notice of Allowance in Korean Appln. No. 10-2018-7020226, dated Jul. 30, 2020, 3 pages.

(Continued)

*Primary Examiner* — Eugene Lee
(74) *Attorney, Agent, or Firm* — Fish & Richardson P.C.

(57) ABSTRACT

A quantum computing device includes multiple co-planar waveguide flux qubits, at least one coupler element arranged such that each co-planar waveguide flux qubit, of the multiple co-planar waveguide flux qubits, is operatively couplable to each other co-planar waveguide flux qubit, of the multiple co-planar waveguide flux qubits, of the quantum computing device, and a tuning quantum device, in which the tuning quantum device is in electrical contact with a first co-planar waveguide flux qubit of the plurality of co-planar waveguide flux qubits and with a second co-planar waveguide flux qubit of the plurality of co-planar waveguide flux qubits.

8 Claims, 7 Drawing Sheets

(56) References Cited

U.S. PATENT DOCUMENTS

| | | | |
|---|---|---|---|
| 2009/0014714 A1* | 1/2009 | Koch | B82Y 10/00 257/31 |
| 2011/0065586 A1* | 3/2011 | Maibaum | B82Y 10/00 505/170 |
| 2012/0124432 A1 | 5/2012 | Pesetski | |
| 2012/0326720 A1 | 12/2012 | Gambetta et al. | |
| 2013/0308956 A1 | 11/2013 | Meyers et al. | |
| 2016/0221825 A1 | 8/2016 | Allen | |
| 2016/0267032 A1 | 9/2016 | Rigetti | |
| 2016/0292586 A1* | 10/2016 | Rigetti | G06N 10/00 |
| 2016/0364653 A1 | 12/2016 | Chow | |
| 2017/0005255 A1 | 1/2017 | Dial | |
| 2017/0089961 A1 | 3/2017 | Abdo | |
| 2017/0148972 A1 | 5/2017 | Thompson | |
| 2018/0013052 A1* | 1/2018 | Oliver | H01L 25/0652 |

FOREIGN PATENT DOCUMENTS

| | | |
|---|---|---|
| CN | 102334206 | 1/2012 |
| CN | 104937661 | 9/2015 |
| EP | 3380995 | 10/2018 |
| JP | 2000-338209 | 12/2000 |
| WO | WO 2015/178990 | 11/2015 |
| WO | WO 2015/178992 | 11/2015 |
| WO | WO 2017/001404 | 1/2017 |
| WO | WO 2017/105429 | 6/2017 |

OTHER PUBLICATIONS

CN Office Action in Chinese Appln. No. 201580085713.5, dated May 8, 2021, 12 pages (with English translation).
AU Office Action in Australian Appln. No. 2020202779, dated Mar. 30, 2021, 5 pages.
Harris et al., "A Compound Josephson Junction Coupler for Flux Qubits With Minimal Crosstalk," Phys. Rev. B., Aug. 2009, 80(5):5 pages.
IN Office Action in Indian Appln. No. 201847025527, dated Mar. 16, 2021, 7 pages (with English translation).
JP Decision to Grant a Patent in Japanese Appln. No. 2019-193542, dated Jan. 18, 2021, 5 pages (with English translation).
KR Notice of Allowance in Korean Appln. No. 10-2020-7031450, dated Jul. 30, 2020, 3 pages.
AU Examination Report No. 1 in Australian Appln. No. 2015417667, dated Jun. 11, 2019, 4 pages.
Barends et al, "Coherent Josephson qubit suitable for scalable quantum integrated circuits," Physical Review Letters, vol. 111, 080502, Aug. 22, 2013 (Aug. 22, 2013). XP055280123, DOI: 10.1103/PhysRevLett.111.080502.
Baust et al, "Tunable and switchable coupling between two superconducting resonators," Physical Review B, vol. 91, 014515, Jan. 30, 2015 (Jan. 30, 2015), XP055300405, DOI: 10.1103/PhysRevB.91.014515.
Biamonte et al., "Realizable Hamiltonians for universal adiabatic quantum computers," Phys. Rev. A 78, 012352 (2008), 7 pages.
CA Office Action in Canadian Appln. No. 3008796, dated Mar. 26, 2019, 4 pages.
JP Notice of Allowance in Japanese Application No. 2018-551746, dated Sep. 13, 2019, 5 pages (with English translation).
Lechner et al, "A quantum annealing architecture with all-to-all connectivity from local, interactions," Science Advances, vol. 1, No. 9. E1500838. Oct. 23, 2015 (Oct. 23, 2015), XP055300406, DOI: 10.1126/sciadv.1500838.
Niemczyk et al, "Selection rules in a strongly coupled qubit-resonator system," arXiv: 1107.08 1Ov1, Jul. 5, 2011 (Jul. 5, 2011), XP080513692, Retrieved from the Internet: https://arxiv.org/abs/1107.0810v1.
PCT International Preliminary Report on Patentability issued in International Application No. PCT/US2015/065995, dated Jun. 28, 2018, 8 pages.
PCT International Search Report for International Application No. PCT/US2015/065995, dated Sep. 22, 2016.
Satoh et al, "Fabrication of superconducting qubits with Al trilayer Josephson junctions," IEEE Transactions On Applied Superconductivity, vol. 25, No. 3, Dec. 4, 2014 (Dec. 4, 2014), XP011570159, DOI: 10.1109/TASC.2014.2378033.
SG Written Opinion in Singaporean Application No. 11201805164W, dated Oct. 11, 2019, 5 pages.
Tsomokos et al, "Using superconducting qubit circuits to engineer exotic lattice systems," arXiv: 1009.2888v2, Nov. 25, 2010 (Nov. 25, 2010), XP080449050, Retrieved from the Internet: http://arxiv.org/abs/1009.2888v2.
Xiang et al, "Hybrid quantum circuits: superconducting circuits interacting with other quantum systems," Reviews of Modern Physics, vol. 85, Apr. 9, 2013 (Apr. 9, 2013), pp. 623-653, XP055280457, DOI: 10.1103/RevModPhys.85.623.
Yan et al, "The flux qubit revisited," arXiv: 1508.06299v1, Aug. 25, 2015 (Aug. 25, 2015), XP055280119, Retrieved from the Internet: http://arxiv.org/abs/1508.06299v1.
Yang et al, "Entangling superconducting qubits in a multi-cavity system," arXiv: 1506.06108v1, Jun. 19, 2015 (Jun. 19, 2015), XP055300404, Retrieved from the Internet: http://arXiv.org/abs/1506.06108v1.

* cited by examiner

PROGRAMMABLE UNIVERSAL QUANTUM ANNEALING WITH CO-PLANAR WAVEGUIDE FLUX QUBITS

CROSS-REFERENCE TO RELATED APPLICATIONS

This application is a continuation of U.S. Ser. No. 16/062,076, filed Jun. 13, 2018, which is a U.S. National Stage Application under 35 U.S.C. § 371 and claims the benefit of International Application No. PCT/US2015/065995, filed on Dec. 16, 2015. The disclosures of the prior applications are considered part of and are incorporated by reference in the disclosure of this application in its entirety.

TECHNICAL FIELD

The present disclosure relates to programmable universal quantum annealing with co-planar waveguide flux qubits.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|0\rangle$.

The "0" and "1" states of a digital computer are analogous to the $|0\rangle$ and $|\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

Quantum annealing is an analog approach to quantum computation. With quantum annealing, also known as adiabatic quantum computing, a computational problem is encoded in interactions among multiple qubits. The encoded computational problem is referred to as the problem Hamiltonian $H_p$. The collection of encoded qubits then is slowly annealed to the lowest energy configuration of a final Hamiltonian $H_f$ representative of a solution to the encoded problem. This model can sometimes be referred to as the adiabatic model of quantum computation.

SUMMARY

In general, in some aspects, the subject matter of the present disclosure is directed to quantum computing devices having multiple qubits, in which the quantum computing devices are fully programmable with the power of a universal quantum computer. The quantum computing devices employ co-planar waveguide flux qubits that allow full connectivity to be achieved among the qubits. Furthermore, the quantum computing devices include at least one tuning quantum device, in which each tuning quantum device is in electrical contact with two different co-planar waveguide flux qubits to allow tuning of the qubit to qubit interactions.

In general, in some aspects, the subject matter of the present disclosure can be embodied in one or more quantum computing devices, in which the quantum computing device includes multiple co-planar waveguide flux qubits, at least one coupler element arranged such that each co-planar waveguide flux qubit, of the multiple co-planar waveguide flux qubits, is operatively couplable to each other co-planar waveguide flux qubit, of the multiple co-planar waveguide flux qubits, of the quantum computing device, and a tuning quantum device, in which the tuning quantum device is in electrical contact with a first co-planar waveguide flux qubit of the plurality of co-planar waveguide flux qubits and with a second co-planar waveguide flux qubit of the plurality of co-planar waveguide flux qubits.

Implementations of the quantum computing devices can include one or more of the following features. For example, in some implementations, each co-planar waveguide flux qubit, of the multiple co-planar waveguide flux qubits, includes (a) a qubit quantum device and (b) an elongated thin film superconductor waveguide electrically coupled in parallel with the qubit quantum device. Each coupler element can be arranged to operatively couple two different co-planar waveguide flux qubits. Each coupler element can be arranged to operatively couple an elongated thin film superconductor waveguide of one of the multiple co-planar waveguide flux qubits to an elongated thin film superconductor waveguide of another one of the multiple co-planar waveguide flux qubits.

In some implementations, the tuning quantum device is a superconducting quantum interference device (SQUID). The SQUID can be a DC-SQUID. A first end of the SQUID can be in electrical contact with the first co-planar waveguide flux qubit between the qubit quantum device and the elongated thin film waveguide of the first co-planar waveguide flux qubit, and a second end of the SQUID can be in electrical contact with the second co-planar waveguide flux qubit between the qubit quantum device and the elongated thin film waveguide of the second co-planar waveguide flux qubit.

In some implementations, for each co-planar waveguide flux qubit of the multiple co-planar waveguide flux qubits, a first end of the elongated thin film superconductor waveguide is in electrical contact with the qubit quantum device and a second end of the elongated thin film superconductor waveguide is in electrical contact with a co-planar ground plane. For each co-planar waveguide flux qubit of the plurality of co-planar waveguide flux qubits, a first elongated side and a second opposite elongated side of the thin film superconductor waveguide can be spaced apart from and co-extensive with the co-planar ground plane. For the tuning quantum device, a first end of the tuning quantum device can be in electrical contact with the first co-planar waveguide flux qubit between the qubit quantum device and the elongated thin film waveguide of the first co-planar waveguide flux qubit, and a second end of the tuning quantum device can be in electrical contact with the second flux qubit between the qubit quantum device and the elongated thin film waveguide of the second co-planar waveguide flux qubit. The tuning quantum device and each qubit quantum device of each co-planar waveguide flux qubit of the multiple co-planar waveguide flux qubits can include a superconducting quantum interference device (SQUID).

In some implementations, for each co-planar waveguide flux qubit of the multiple co-planar waveguide flux qubits, the qubit quantum device includes a superconducting quantum interference device (SQUID). For each co-planar waveguide flux qubit of the multiple co-planar waveguide flux qubits, the SQUID can be a DC-SQUID.

In some implementations, each coupler element includes a thin film superconductor, and, for each coupler element, the thin film superconductor is spaced apart from a corresponding first elongated thin film superconductor waveguide of a first one of the multiple co-planar waveguide flux qubits and from a corresponding second elongated thin film superconductor waveguide of a second one of the co-planar waveguide flux qubits to allow inductive coupling between the first corresponding elongated thin film superconductor waveguide and the second corresponding elongated thin film superconductor waveguide.

In some implementations, the quantum computing device further includes, for each co-planar waveguide flux qubit of the multiple co-planar waveguide flux qubits, a corresponding qubit readout device operatively couplable to the elongated thin film superconductor waveguide of the co-planar waveguide flux qubit. For each co-planar waveguide flux qubit of the multiple co-planar waveguide flux qubits, the corresponding qubit readout device includes a serpentine-shaped thin film superconductor spaced apart from a side of the elongated thin film superconductor waveguide of the co-planar waveguide flux qubit to enable inductive coupling between the qubit readout device and the elongated thin film superconductor waveguide.

In some implementations, the multiple co-planar waveguide flux qubits, the at least one coupler, and the tuning quantum device are arranged on a dielectric substrate.

In some implementations, the quantum computing device is represented by the Hamiltonian:

$$H = \sum_{i}^{N} h_i \sigma_z^i + \sum_{i,j}^{N} (J_{ij} \sigma_z^i \sigma_z^j + K_{ij} \sigma_x^i \sigma_x^j) \text{ for } i = 1 \ldots N, j = 1 \ldots N,$$

in which N is the number of qubits in the quantum computing device, $h_i$ is the local bias on co-planar waveguide flux qubit i, $\sigma_z$ and $\sigma_x$ represent the Pauli matrices, and $J_{ij}$ and $K_{ij}$ are the coupling strength between co-planar waveguide flux qubits i and j.

The subject matter of the present disclosure may have various advantages. For example, in some implementations, the quantum computing devices of the present disclosure overcome the limited coupling capability of certain other quantum computing device designs to provide full connectivity among qubits of the device, regardless of the number of qubits in the device. In some implementations, the full connectivity can be achieved using co-planar waveguide flux qubits. In turn, the full connectivity allows, in some implementations, the quantum computing devices to operate as universal quantum computers. In addition, the quantum computing devices according to the present disclosure include tuning quantum devices that allow tuning of the local flux biases associated with each qubit, and therefore provide fully programmable quantum computing devices. In some implementations, the co-planar waveguide flux qubits exhibit relatively long decoherence times.

The details of one or more embodiments are set forth in the accompanying drawings and the description below. Other features and advantages will be apparent from the description, the drawings, and from the claims.

DETAILED DESCRIPTION

Figure 1A:
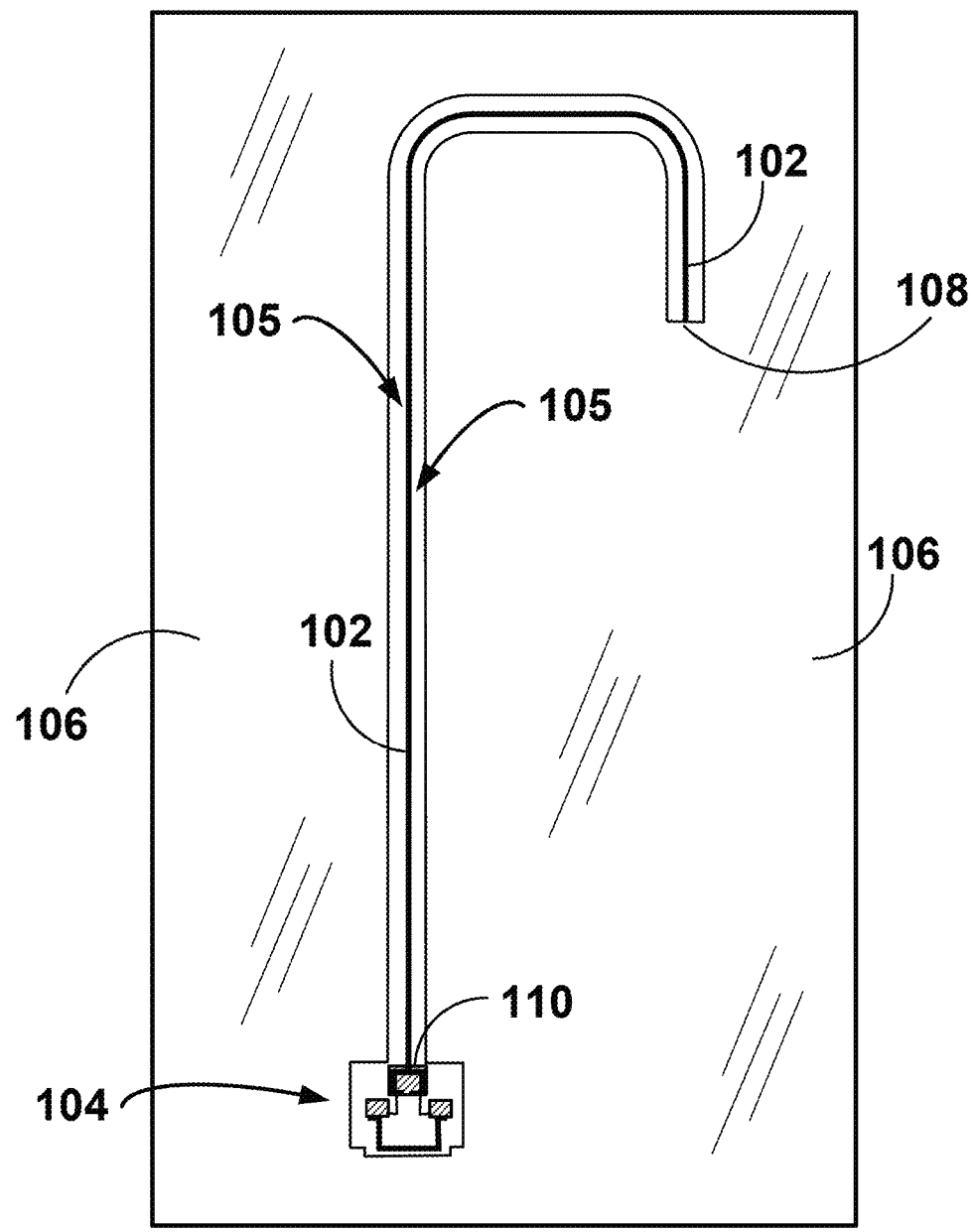
FIG. 1A is a schematic illustrating a top view of an example of a co-planar waveguide flux qubit.

In an adiabatic quantum computing device, also referred to as a quantum annealer, the qubits of the annealer are operatively coupled together in a controllable manner such that the quantum state of each qubit affects the corresponding quantum states of the qubits to which it is coupled. The computing power of a quantum annealer can be significantly improved by increasing the number of other qubits to which each qubit couples. With sufficient coupling among qubits, a quantum annealer can, in certain instances, be constructed to have the power of a universal quantum computer. A universal quantum computer can be understood to be a controlled device that, operating at the quantum level, efficiently simulates the dynamics of any other many-particle quantum system.

For certain quantum computing devices, the type of qubit used in the device limits coupling to a qubit's nearest neighbors. An example of such a potentially limiting qubit design is the persistent current flux qubit, which includes a loop of superconducting material interrupted by three Josephson junctions and stores information in the qubit phase or flux states. For quantum annealers that employ large numbers of qubits, such qubit designs typically do not allow each qubit in the device to couple to each other qubit of the device, i.e., the quantum computers do not provide full connectivity between qubits. As a result, those quantum computing systems cannot truly realize a universal quantum computer for any number of qubits. Expressed in another way, it has been proposed that such designs, which can be represented as Ising Hamiltonians, do not result in a universal quantum computer due to the absence of non-Ising interactions and limited coupling between qubits.

Furthermore, for certain qubit designs, the interactions with other qubits supplies a potentially strong source of decoherence, leading to lower qubit decoherence times, e.g., on the order of 10 ns. Decoherence time corresponds to the duration of time it takes for a qubit to lose some of its quantum mechanical properties, e.g., the qubit is no longer characterized by a superposition of basis states and the qubit cannot be used in quantum computation. Another source of decoherence includes noise generated from the materials used to construct a qubit, such as the dielectrics forming the Josephson junctions.

In general, in some aspects, the subject matter of the present disclosure is directed to a quantum annealer having multiple qubits, in which the quantum annealer is fully programmable with the power of a universal quantum computer for theoretically any number of qubits. The quantum annealers employ co-planar waveguide flux qubits that allow full connectivity to be achieved among the qubits while also providing for improved decoherence times. Furthermore, the quantum annealers include at least one tuning quantum device, in which each tuning quantum device is in electrical contact with two different co-planar waveguide flux qubits to allow tuning of the qubit to qubit interactions.

Co-Planar Waveguide Flux Qubit

Figure 1B:
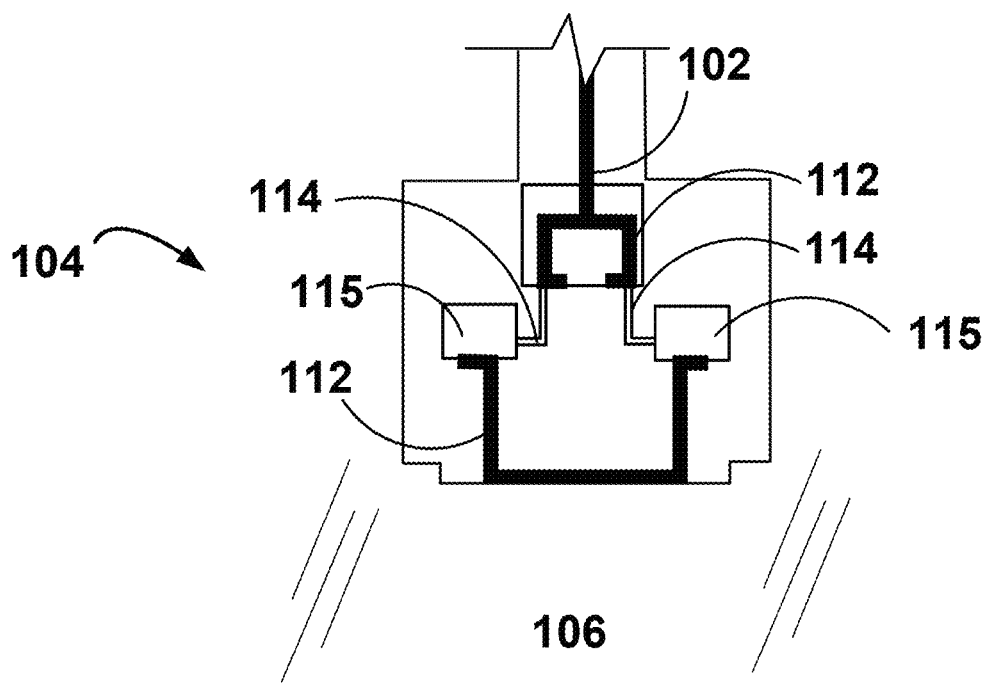
FIG. 1B is a schematic illustrating a close-up view of an example Superconducting Quantum Interference Device (SQUID) used in the co-planar waveguide flux qubit from FIG. 1A.

Before providing a description of fully programmable universal quantum annealers that employ co-planar waveguide flux qubits, an overview of a co-planar waveguide flux qubit is provided with respect to FIGS. 1A-1B. FIG. 1A is a schematic illustrating a top view of an example of a co-planar waveguide flux qubit 100. Qubit 100 includes a co-planar waveguide 102 that is coupled to a quantum device 104. The quantum device 104 can include, but is not limited to, superconducting quantum interference devices (SQUIDS). In the present example, the quantum device 104 is a DC-superconducting quantum interference device (DC-SQUID), though other SQUID devices may be used. The co-planar waveguide 102 and DC-SQUID 104 are surrounded by and are in electrical contact with a ground plane 106. Each of waveguide 102, DC-SQUID 104 and ground plane 106 is formed from a superconducting thin film material using standard thin film fabrication processes on a dielectric substrate. Waveguide 102 is arranged on the substrate as an elongated thin film, in which one end 108 of the thin film is in electrical contact with the ground plane 106 and another opposite end 110 of the thin film is in electrical contact with DC-SQUID 104. The elongated sides of the waveguide 102 are separated from the ground-plane 106 by corresponding and co-extensive gaps 105. In the present example, the width of each respective gap 105 is constant along the length of the elongated waveguide, e.g., to avoid unnecessary reflection of the electromagnetic wave. The desired mode profile of a waveguide is the symmetric co-planar waveguide (CPW) mode, with the two ground planes on either side of the center trace held to the same voltage. In some implementations, the waveguide 102 may have a length (measured along the elongated sides) of up to about several thousands micrometers, and a width (as measured transverse to the length) of up to about several tens of micrometers. The thickness of the deposited film forming the waveguide 102 (as well as the ground plane 106 and portions of the DC-SQUID) may be, e.g., on the order of 100 to 200 nm.

In some implementations, the end of the waveguide 102 furthest from the DC-SQUID has a hook shape so as to provide a region for inductively coupling the qubit to a readout device (not shown). FIG. 1B is a schematic illustrating a close-up view of DC-SQUID 104 coupled to waveguide 102. DC-SQUID 104 includes a loop 112 of superconducting material that is interrupted by two Josephson junctions 114, each of which can be formed from a thin-film non-superconducting/insulating material. For example, the Josephson junctions 114 may be formed from a tri-layer of Al/Al$_2$O$_3$/Al thin films. Thus, the Josephson junctions 114 are coupled in parallel with one another, with a first common node in electrical contact with the waveguide 102 and a second common node in electrical contact with the ground plane 106. The Josephson junctions 114 are electrically connected to the loop 112 through contact pads 115 that may be formed from the same or different superconducting material as the loop 112. In some implementations, the contact pads 115 are absent and the Josephson junctions 114 are in direct physical and electrical contact with the loop 112. Each of waveguide 102, DC-SQUID 104, and ground-plane 106 may be formed from materials exhibiting superconducting properties at or below a superconducting critical temperature, such as aluminum (superconducting critical temperature of 1.2 kelvin) or niobium (superconducting critical temperature of 9.3 kelvin). The substrate on which the waveguide 102, DC-SQUID 104 and ground-plane 106 are formed includes a dielectric material such as, e.g., sapphire, SiO$_2$ or Si. In some implementations, sapphire provides an advantage of low dielectric loss, thus leading to higher decoherence times.

Figure 1C:
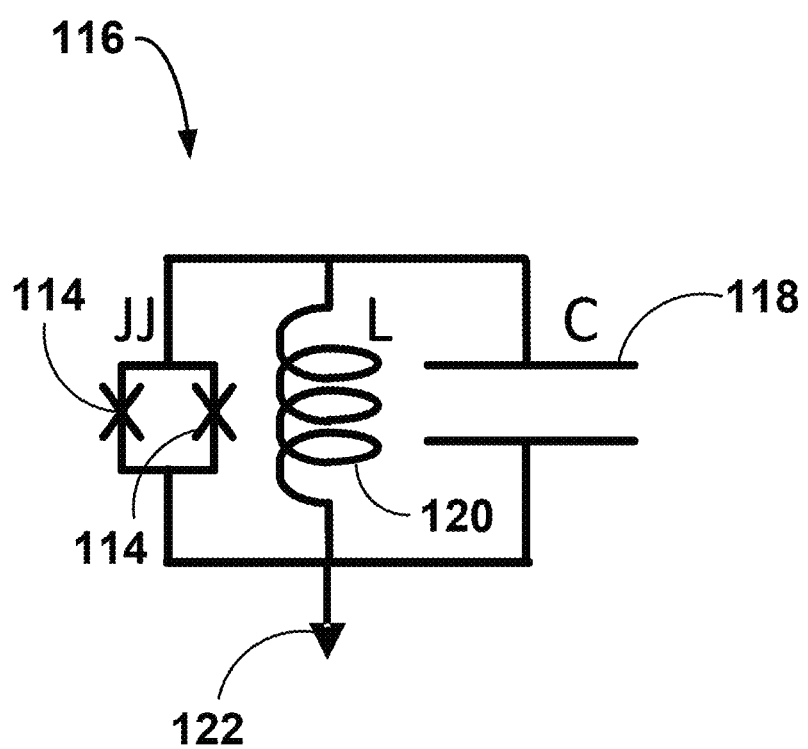
FIG. 1C is a schematic illustrating a circuit diagram representative of the co-planar waveguide flux qubit of FIG. 1A.

Co-planar waveguide flux qubit 100 may operate, in some implementations, in a similar manner to a persistent current flux qubit. That is, when a magnetic flux is introduced to the co-planar waveguide, two persistent current states may be generated that circulate in the co-planar waveguide loop in opposite directions. Such magnetic fluxes may be introduced by, e.g., an on-chip flux bias line. The flux bias line can be a thin film superconductor and can inductively couple to the co-planar waveguide when the flux bias line is activated by providing the bias line with current. The waveguide 102 also serves as a resonator through which strong and long range coupling to other qubits may be achieved. FIG. 1C is a schematic illustrating a circuit diagram 116 representative of qubit 100. As shown in the circuit diagram 116, qubit 100 is associated with both a capacitance 118 and an inductance 120 that are coupled in parallel with the two Josephson junctions 114 provided by the DC-SQUID 104. Ground 122 in the circuit diagram 116 is provided by ground-plane 106. The capacitance and inductance values of the waveguide are determined based on the thin film thickness, width, length, gap spacing to the co-planar ground plane, and substrate. Thus, for a co-planar waveguide flux qubit, such as qubit 100, the capacitance 118 and inductance 120 of the resonator portion of the qubit are provided by waveguide 102, whereas for a persistent current flux qubit, the capacitance and inductance are established using a third Josephson junction within the superconducting loop.

The co-planar waveguide flux qubit design may have several advantages relative to the persistent current flux qubit. For instance, the co-planar waveguide flux qubit may exhibit relatively long decoherence times. Without wishing to be bound by theory, it is believed the improved decoherence time is due, in part, to the co-planar waveguide flux qubit utilizing primarily a single layer of superconducting material to form the flux qubit. By using a single layer of superconducting material on the substrate, sources of decoherence that would otherwise exist due to additional material layers are removed. Similarly, it is believed that the dielectric materials normally used to form the Josephson junctions are also strong sources of decoherence in flux qubits. Thus, by replacing the third Josephson junction in a persistent current flux qubit with the co-planar waveguide, an additional source of decoherence is eliminated, and the decoherence time associated with the qubit can be substantially increased.

In addition, the co-planar waveguide flux qubit allows for coupling to a greater number of qubits. In a typical persistent current flux qubit, coupling within a quantum computer is achieved using the nearest neighbor devices, essentially limiting the number of qubits available for coupling to those that can be fit within the area around a single qubit. Because of the limited connectivity to other qubits, a quantum processor based on such a qubit design suffers from the so-called embedding problem. This means a computational problem needs to be programmed on the machine given the constraints of a Chimera graph. Solving the embedding problem can be a computationally hard task by itself, which further limits the power of quantum annealer.

In contrast, coupling with the co-planar waveguide flux qubit is accomplished through inductive coupling to the waveguide portion of the qubit. Since the waveguide distributes its inductance and capacitance over a macroscopic length (several mm), the number of qubits to which one can couple can be substantially increased, thus allowing one to potentially avoid the embedding problem. Furthermore, persistent current flux qubits typically are very small and are associated with sizes on the mesoscopic scale (e.g., having critical dimensions on the order of several microns or less). For a co-planar waveguide flux qubit, however, the structures can be fabricated to be much larger (e.g., on the order of millimeters), leading to a higher fabrication reliability.

Programmable Universal Quantum Annealer with Co-Planar Waveguide Flux Qubits

Without wishing to be constrained by theory, a quantum annealer can be said to have the computational power of a universal quantum computer if the Hamiltonian (interactions) of the quantum annealer has a so called non-stoquastic term with tunable coefficients. A non-stoquastic Hamiltonian is a Hamiltonian with both positive and negative off-diagonal terms. For instance, the following Hamiltonian has been proposed as having the form that is representative of a universal quantum computer:

$$H = \sum_{i}^{N} h_i \sigma_z^i + \sum_{i,j}^{N} (J_{ij} \sigma_z^i \sigma_z^j + K_{ij} \sigma_x^i \sigma_x^j), \quad (1)$$

where N is the total number of qubits in the system, $h_i$ is the local bias on qubit i, $\sigma_z$ and $\sigma_x$ represent the Z and X Pauli matrices respectively for a qubit, and $J_{ij}$ and $K_{ij}$ are the coupling strength between qubits i and j. A problem instance is encoded in the h and J values, which are user-programmable. As explained above, quantum computing devices that employ certain qubit designs, such as persistent current flux qubits, are limited in that they do not provide full connectivity. That is, such systems are missing the $K_{ij}\sigma_x^i\sigma_x^j$ term in Eq. (1), and therefore cannot be used to realize a fully programmable annealer with the power of a universal quantum computer. In contrast, a quantum annealer constructed according to the present disclosure can be constructed to include the missing $K_{ij}\sigma_x^i\sigma_x^j$ term of Eq. (1).

Figure 2A:
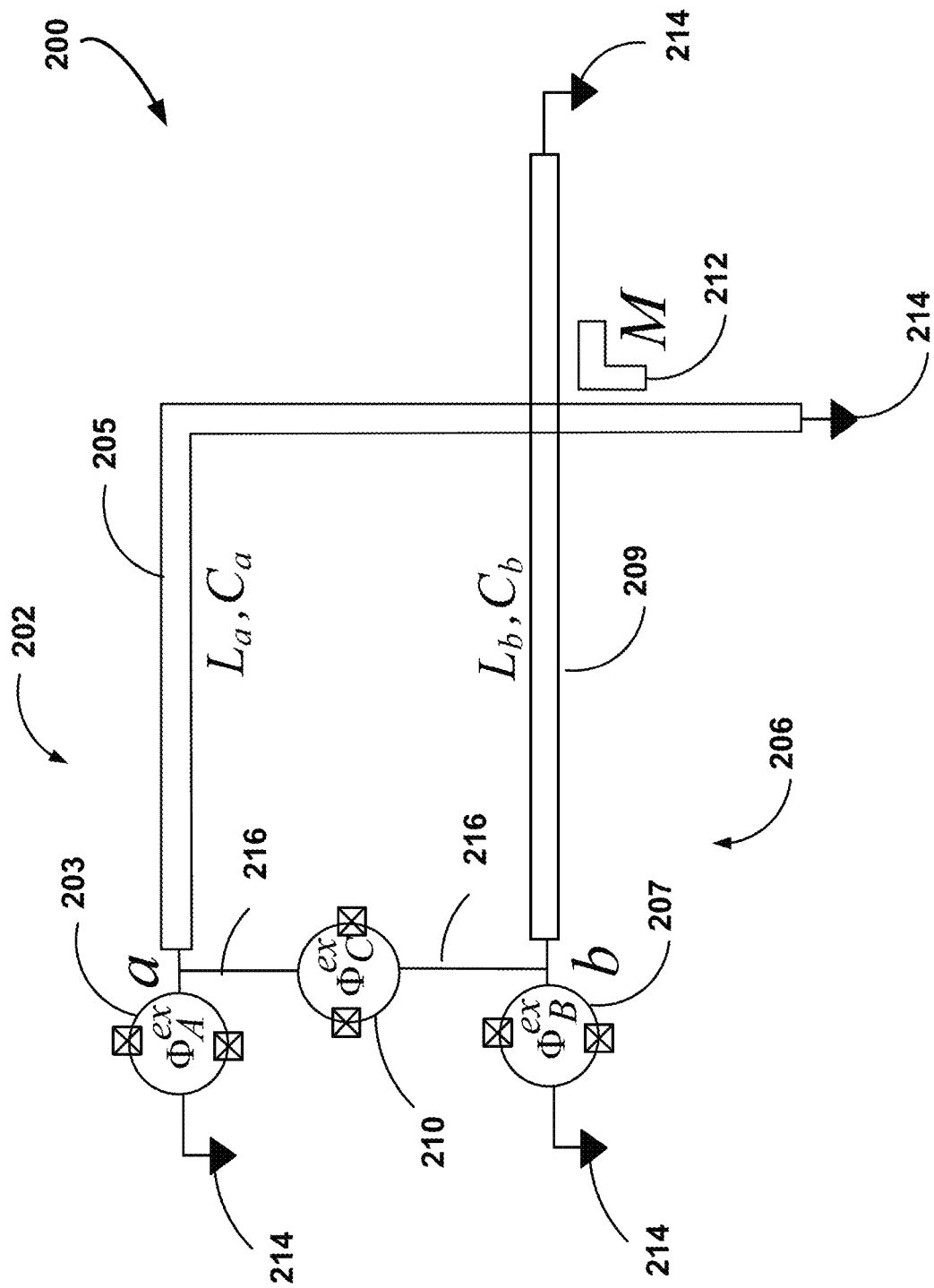
FIG. 2A is a schematic that illustrates an example of a quantum annealer that is capable of operating as a fully programmable universal quantum computer.

FIG. 2A is a schematic that illustrates an example of a quantum annealer 200 that employs two co-planar waveguide flux qubits 202, 206, constructed as described above. The design shown in FIG. 2 can be expanded for use with any integer number, N, of qubits greater than 2. The first qubit 202 includes a quantum device 203 (e.g., a DC-SQUID) that is electrically connected to an elongated thin film superconducting waveguide 205. The second qubit 206 also includes a quantum device 207 (e.g., a DC-SQUID) that is electrically connected to the elongated thin film superconducting waveguide 209. Each thin film waveguide 205, 209 is in electrical contact with a co-planar superconducting ground plane, indicated by 214 in FIG. 2A, and is designed such that the waveguides cross over each other to provide a region for coupling between the qubits, as described below. For ease of viewing, the layout of the co-planar ground plane relative to the waveguides 205, 2209 and other components is not shown in FIG. 2A. The quantum devices 203, 207 of each qubit are also in electrical contact with ground 214. As a result, the elongated thin film waveguide of each qubit can be said to be coupled in parallel with the corresponding quantum device of the qubit. Each elongated thin film superconducting waveguide also is associated with a corresponding inductance and capacitance. For example, the waveguide 205 of qubit 202 has an inductance $L_a$ and capacitance $C_a$, whereas the waveguide 209 of qubit 206 has an inductance $L_b$ and capacitance $C_b$.

Each quantum device 203, 207 is represented in FIG. 2A by a loop interrupted by a box in which a cross is embedded. For the configuration shown in FIG. 2A in which the quantum devices are DC-SQUIDs, the loop is formed of a superconducting thin film material that is interrupted by two Josephson junctions, each represented by a box containing the embedded cross. During operation of the annealer 200, each quantum device 203, 207 also is associated with a corresponding local external flux bias ($\Phi_a^{ex}$ or $\Phi_b^{ex}$).

A tuning quantum device 210 is arranged so that it is in electrical contact with each of the qubits 202, 206. Tuning quantum device 210 is operable to tune the magnitude of the interactions between the qubits to which it is connected. Tuning quantum device 210 allows a user to program the quantum annealer by setting, e.g., the magnitude of the coefficients $J_{ij}$ and $K_{ij}$ in the Hamiltonian. In the example of FIG. 2A, those qubits are qubit 202 and qubit 206. Since the tuning quantum device 210 shown in FIG. 2A is a DC-SQUID, the magnitude of the qubit-qubit interactions are tuned by altering the local external flux bias $\Phi_c^{ex}$ associated with the DC-SQUID during operation of the annealer 200. As with quantum devices 203, 207, the DC-SQUID 210 is represented by a loop interrupted by two cross-embedded boxes, where each box corresponds to a Josephson junction and the loop is formed from a superconducting thin film. A first end/contact of the loop in tuning quantum device 210 is in electrical contact with first qubit 202 at node a between the quantum device 203 and the elongated thin film waveguide 205. A second end/contact of the tuning quantum device 210 is in electrical contact with second qubit 206 at node b between the quantum device 207 and the elongated thin film waveguide 209. To alter the local external flux bias $\Phi_c^{ex}$ of tuning quantum device 210, an external magnetic flux $\Phi_{ex}$ can be applied to the annealer 200. In the case the tuning quantum device 210 is a DC-SQUID, the flux, in turn, tunes the critical current of the DC-SQUID, which sets the overall strength of the coupling. The external magnetic flux may be provided by a flux bias line (not shown in FIG. 2), as explained above.

The connections between the tuning quantum device 210 and the qubits 202, 206 are provided by wires 216. Wires 216 can also be formed from a thin film superconductor, similar to the waveguides and ground plane, and thus may also be understood as being co-planar in terms of geometry. The capacitance of the wires 216 can be safely ignored at the frequency of operation of the quantum annealer 200 (the operating frequency of the qubits at which the microwave excitations oscillate), which is about 6 GHz or less. The inductance of wires 216, however, should be accounted for when designing and operating the annealer 200 since such inductance can reduce the coupling strength between qubits and induce instability/decoherence. Accordingly, the wires 216 should have an inductance that is less than the coupler junction inductance. Typical coupler junction inductance can be in the range of, e.g., a few nH to tens of nH. Thus, for example, the inductance of wires 216 may be limited to between about 100 pH to about 10000 pH. This inductance value then sets an upper limit on the geometrical constraints of the wires 216.

The qubits 202 and 206 are operatively couplable to one another through a coupler element 212. That is, during operation of the quantum annealer 200, the quantum state of qubit 202 can be entangled with the quantum state of qubit 206 by allowing inductive coupling from waveguide 205 to waveguide 209 through coupler element 212. Coupler element 212 includes, for example, a loop of superconducting thin film material, in which a first portion of the loop extends in a first direction along the waveguide 205 and a second portion of the loop extends in a second orthogonal direction along the waveguide 209, with a right angle bend where the waveguides 205, 209 cross. Though waveguides 205, 209 are shown in FIG. 2A as overlapping one another near coupler element 212, the waveguides are not in electrical contact at the crossing. Rather, they are separated from one another using a jumper, such as, e.g., a cross-over air-bridge that allows one of the two waveguides to pass over the other at the crossing without coming into contact. Other designs for enabling the waveguides 205, 209 to cross one another without electrical contact may be used instead. The coupler element 212 is laterally separated from each waveguide by a thin gap (e.g., on the order of a few microns). During operation of the processor, energy from one waveguide (e.g., waveguide 205) can be inductively coupled to the superconducting thin film coupler 212, which then is inductively coupled to the other waveguide (e.g., waveguide 209) arranged near the coupler element 212. The coupler 212 element also is physically separate from the co-planar ground plane. As shown in FIG. 2A, the coupler element 212 is associated with a mutual coupling parameter M. The mutual coupling parameter M represents the effective mutual inductance of the coupler element 212 between two qubits. In some implementations, the coupler element 212 is tunable. That is, the loop can include a Josephson junction or a DC-SQUID. In this way, a flux bias can be applied to coupler element 212 (e.g., from a flux bias line as described herein) that allows one to alter the effective mutual inductance M by changing the inductance of the junction of DC-SQUID. The coupler element 212 can be defined with three parameters: a trace width W, a loop arm length L and a gap distance G (i.e., the interior distance between loop arms). The trace width W may be, in some implementations, in the range of about 1-5 microns. The loop arm length L may be, in some implementations, on the order of few hundred microns, depending on the number of qubits in the network. The gap distance G may be, in some implementations, on the order of few tens of microns. Other ranges may also be used. The circuit elements shown in FIG. 2A and the co-planar ground plane are formed on a substrate, which can include, e.g., a dielectric material such as sapphire or $SiO_2$, or a semiconductor such as Si.

Figure 2B:
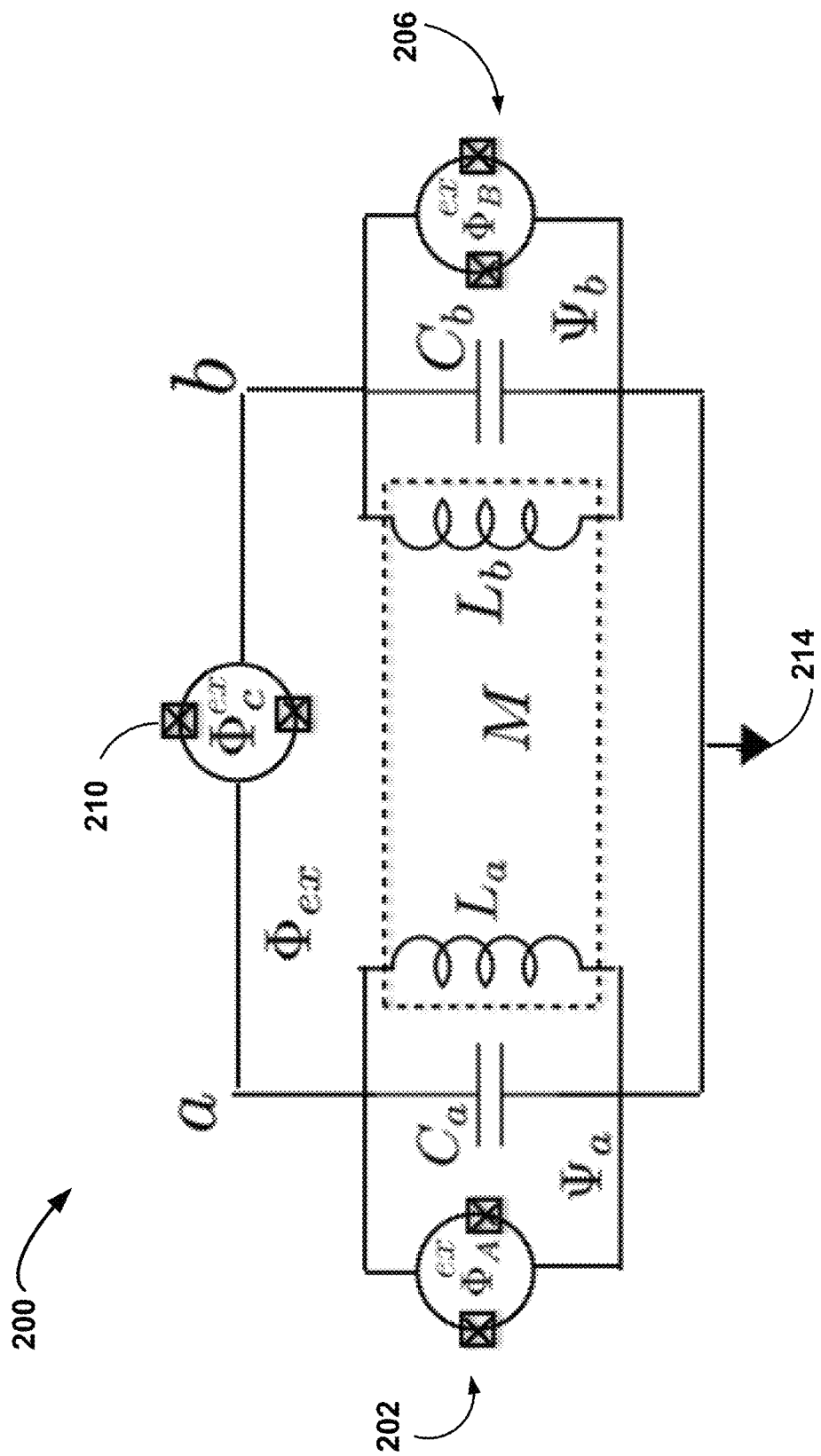
FIG. 2B is a schematic that illustrates a circuit diagram equivalent for the quantum annealer shown in FIG. 2A.

FIG. 2B is a schematic that illustrates a circuit diagram equivalent for the quantum annealer 200 shown in FIG. 2A. As shown in FIG. 2B, the co-planar waveguides 205, 209 are now represented by their circuit equivalents: capacitor $C_a$ and inductor $L_a$ for waveguide 205, and capacitor $C_b$ and inductor $L_b$ for waveguide 209. The mutual coupling M between the qubits is denoted using a dashed box that encloses the inductors. Again, during operation of the annealer 200, each DC-SQUID is associated with its own local external flux bias: $\Phi_c^{ex}$ for tunable quantum device 210, $\Phi_a^{ex}$ for the DC-SQUID of qubit 202 and $\Phi_b^{ex}$ for the DC-SQUID of qubit 206. FIG. 2B also depicts the presence of an external flux $\Phi_{ex}$ that is applied to the device 200. Each of the external flux $\Phi_{ex}$, and the local external flux biases $\Phi_a^{ex}, \Phi_b^{ex}$, and $\Phi_c^{ex}$ can be varied independently by varying the current applied to a corresponding flux bias line (not shown). As shown in FIG. 2B, each qubit also is associated with a corresponding flux bias: $\Psi_a$ for qubit 202 and $\Psi_b$ for qubit 206.

Using the circuit diagram shown in FIG. 2B, it is possible to derive a Hamiltonian representative of quantum annealer 200 from classical current-voltage equations as follows (note: the flux bias of the DC-SQUIDs are dropped in the following equations for simplicity, i.e., $$I_x \cos\left(\frac{2\pi}{\Phi_0}\Phi_x^{ex}\right) \to I_x,$$

for x=a, b, c, where $\Phi_0$ is the superconducting magnetic flux quantum):

$$C_a \ddot{\Phi}_a = \frac{\Phi_a - \Psi_a}{L_a} + \frac{\Phi_b}{M} + I_a \sin\left(\frac{2\pi}{\Phi_0}\Phi_a\right) + I_c \sin\left(\frac{2\pi}{\Phi_0}(\Phi_a - \Phi_b + \Phi_{ex} + \Psi_a + \Psi_b)\right) \quad (2)$$

$$C_b \ddot{\Phi}_b = \frac{\Phi_b - \Psi_b}{L_b} + \frac{\Phi_a}{M} + I_b \sin\left(\frac{2\pi}{\Phi_0}\Phi_b\right) - I_c \sin\left(\frac{2\pi}{\Phi_0}(\Phi_a - \Phi_b + \Phi_{ex} + \Psi_a + \Psi_b)\right), \quad (3)$$

where $I_c$ is the current through the tuning quantum device 210.

The quantum Hamiltonian corresponding to the foregoing circuit model can be expressed as:

$$H = \frac{Q_a^2}{2C_a} + \frac{Q_b^2}{2C_b} + \frac{(\Phi_a - \Psi_a)^2}{2L_a} + \frac{(\Phi_b - \Psi_b)^2}{2L_b} - \frac{I_a \Phi_0}{2\pi}\cos\left(\frac{2\pi}{\Phi_0}\Phi_a\right) - \frac{I_b \Phi_0}{2\pi}\cos\left(\frac{2\pi}{\Phi_0}\Phi_b\right) - \frac{I_c \Phi_0}{2\pi}\cos\left(\frac{2\pi}{\Phi_0}(\Phi_a - \Phi_b + \Phi_{ex} + \Psi_a + \Psi_b)\right) + \frac{M}{L_a L_b}\Phi_a \Phi_b \quad (4)$$

By transforming Eq. (4) to dimensionless phase coordinates, $$\phi = \frac{2\pi}{\Phi_0}\Phi - \pi,$$

the Hamiltonian can be alternatively expressed as:

$$H = 8E_C^a \frac{q_a^2}{2} + 8E_C^b \frac{q_b^2}{2} + E_L^a \frac{(\phi_a - \psi_a)^2}{2} + E_L^b \frac{(\phi_b - \psi_b)^2}{2} + \beta_a E_L^a (\cos(\phi_a) - 1) + \beta_b E_L^b (\cos(\phi_b) - 1) + \frac{I_c \Phi_0}{2\pi}\cos(\phi_a - \phi_b + \phi_{ex} + \psi_a + \psi_b) + \frac{E_L^a E_L^b}{E_M}(\phi_a + \pi)(\phi_b + \pi) \quad (5)$$

Because Eq. (5) includes the parameter $\Phi_c^{ex}$, the Hamiltonian is actually a more general version of the Hamiltonian given in Eq. (1). That is, the externally applied flux is a free parameter that allows additional freedom of choice of the universal Hamiltonian. A 2-qubit quantum annealer having the Hamiltonian given in Eq. (5) can be used to perform any computation that a digital computer of the same size (2-bits) can do.

Reduction to Lowest Two Levels—To reduce the system to a 2-level quantum system from a general infinite level system, the system is truncated to the lowest two levels. The $\sigma_x \sigma_x$ (also expressed as "XX" for short) term of Eq. (5) can be expressed as follows:

$$\frac{E_L^a E_L^b}{E_M} \phi_a \phi_b \rightarrow \langle 0_a | \phi_a | 1_a \rangle \langle 0_b | \phi_b | 1_b \rangle \sigma_x^a \sigma_x^b. \quad (6)$$

Assuming similar qubits, Eq. (6) can be reduced to $\langle 0|\phi|1\rangle^2 \sigma_x^a \sigma_x^b$.

From the parity properties of qubits level wave-functions, we have the following relations:

$$\cos(\phi) = \quad (7)$$
$$\frac{\langle 0|\cos(\phi)|0\rangle + \langle 1|\cos(\phi)|1\rangle}{2}\sigma_0 + \frac{\langle 1|\cos(\phi)|1\rangle - \langle 0|\cos(\phi)|0\rangle}{2}\sigma_x$$

$$\sin(\phi) = \langle 0|\sin(\phi)|1\rangle \sigma_x. \quad (8)$$

The non-stoquastic term of Eq. (5) can be expressed as:

$$\frac{I_c \Phi_0}{2\pi} \cos(\phi_a - \phi_b + \phi_{ex} + \psi_a + \psi_b) = \quad (9)$$
$$\frac{I_c \Phi_0}{2\pi}[\cos(\phi_a - \phi_b)\cos(\phi_{ex} + \psi_a + \psi_b) -$$
$$\sin(\phi_a - \phi_b)\sin(\phi_{ex} + \psi_a + \psi_b)]$$

By tuning the external flux $\Phi_{ex}$ in Eq. (5), it is possible to obtain the special case corresponding to Eq. (1), also referred to as Mode 1. In particular, the qubit flux biases $\Psi_a$ for qubit 202 and $\Psi_b$ for qubit 206 are balanced with the external flux bias $\Phi_{ex}$ to zero to simplify the third term on the right side of Eq. (5), i.e., $$\phi_{ex} + \Psi_a + \Psi_b = 0 \rightarrow \frac{I_c \Phi_0}{2\pi}\cos(\phi_0 - \phi_b),$$

resulting in:

$$H_{XXZZ} = \frac{I_c \Phi_0}{2\pi}\left(\frac{\cos_a^{00}(\phi) + \cos_a^{11}(\phi)}{2}\sigma_0^a + \frac{\cos_a^{11}(\phi) + \cos_a^{00}(\phi)}{2}\sigma_z^a\right) \quad (10)$$
$$\left(\frac{\cos_b^{00}(\phi) + \cos_b^{11}(\phi)}{2}\sigma_0^b + \frac{\cos_b^{11}(\phi) + \cos_b^{00}(\phi)}{2}\sigma_z^b\right) +$$
$$\frac{I_c \Phi_0}{2\pi}\sin_a^{01}(\phi)\sin_b^{01}(\phi)\sigma_x^a \sigma_x^b.$$

The superscripts represent notations for the coefficients in Eq. (7). For instance, $\cos^{00}(\varphi)$ corresponds to $\langle 0|\cos(\varphi)0\rangle$. If similar qubits are assumed, then Eq. (10) can reduce to:

$$H_{XXZZ} = \frac{I_c \Phi_0}{2\pi}\left(\frac{\cos^{11}(\phi)^2 - \cos^{00}(\phi)^2}{4}(\sigma_z^a + \sigma_z^b) + \quad (11)$$
$$\frac{(\cos^{11}(\phi) - \cos^{00}(\phi))^2}{4}\sigma_z^a \sigma_z^b + \sin^{01}(\phi)^2 \sigma_x^a \sigma_x^b\right].$$

Alternatively, in some implementations, Eq. (5) can return a Hamiltonian of the form $J_{ij}\sigma_x^i \sigma_x^j + K_{ij}(\sigma_x^i \sigma_z^j + \sigma_z^i \sigma_x^j)$, also referred to as Mode II.

Figure 2C:
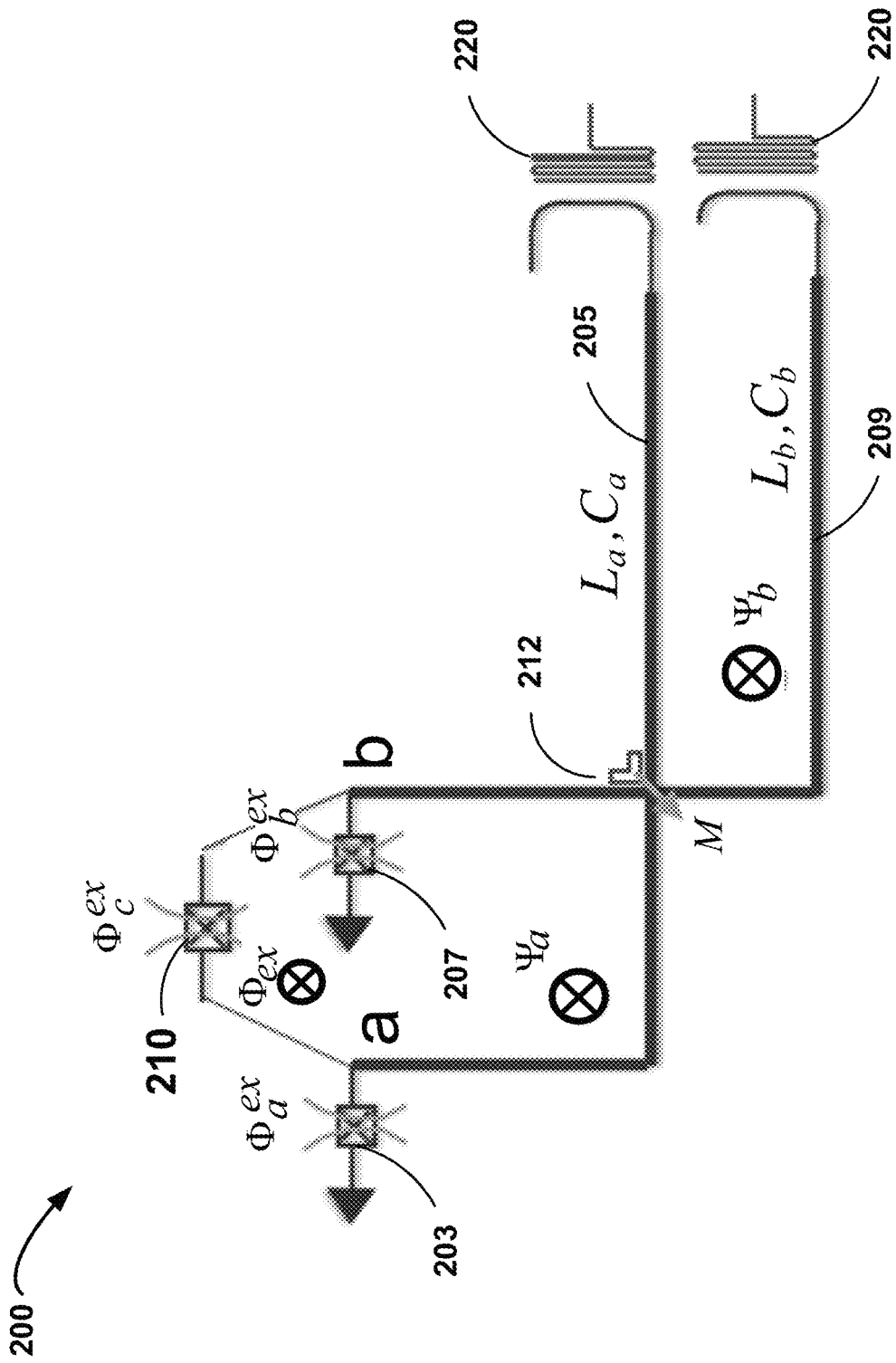
FIG. 2C is a schematic that illustrates an alternative view of the quantum annealer shown in FIG. 2A.

FIG. 2C is a schematic that illustrates an alternative view of the quantum annealer 200. As shown in FIG. 2, the boxes with the embedded crosses each represent a single DC-SQUID, not a Josephson junction as in FIGS. 2A-2B. Thus, tuning quantum device 210 is electrically connected to node b between SQUID 207 and thin film superconducting waveguide 209, and electrically connected to node a between SQUID 203 and thin film superconducting waveguide 205. The local flux biases ($\Phi_a^{ex}$, $\Phi_b^{ex}$, $\Phi_c^{ex}$) through the SQUIDs are also depicted as extending along directions that are transverse to the externally applied flux bias $\Phi_{ex}$, and to the flux bias ($\Psi_a$, $\Psi_b$) through each qubit resonator.

FIG. 2C also illustrates readout devices 220, each of which is arranged within a coupling distance to a thin film superconducting waveguide of a corresponding qubit, such that the readout device 220 is operatively couplable to the qubit. During a readout operation, the readout device 220 reads the state of the qubit to which it couples. In the context of a quantum processor, readout devices such as device 220 are used to read out the final state of the qubit to produce, e.g., a bit string. In the example shown in FIG. 2C, each readout device 220 includes an elongated thin film superconductor (e.g., aluminum or niobium) that is arranged on the dielectric substrate in a serpentine pattern and that is configured to inductively couple from a first end to the adjacent waveguide. That is, the readout device 220 is not in direct electrical connection with the waveguide (other than through the relatively weak electric connection of ground plane 1106), but can, during use, be inductively coupled to qubit 1100 through the waveguide. The separation between the co-planar waveguide and the readout device can be, e.g., about 2 microns. At a second opposite end of the readout device 220, the readout device can be further coupled to other elements that are formed on the substrate/chip or externally to the substrate/chip, such as routing circuitry (e.g., latching elements, a shift register, or a multiplexer circuit).

The quantum annealer 200 having the generalized Hamiltonian of Eq. (5) can be used for quantum computation in various ways. For example, to solve an optimization problem, the function to be minimized is written in the form of a Hamiltonian. The magnetic fluxes $\Phi_{ex}$, $\Psi_a$, and $\Psi_b$ are individually set (using flux bias lines as described herein) such that annealer 200 matches the selected Hamiltonian, thus encoding the ground-state of the problem Hamiltonian. The system then is slowly annealed from time t=0 until t=T, such that it evolves into the ground state of the solution Hamiltonian. At time T, the state of the system is measured using readout devices 220. In some implementations, the quantum annealer 200 can be used to solve problems for specific cases that utilize the Ising Hamiltonian alone. To do so, the third line of Eq. (5) is set to zero by turning off the interactions with the tuning quantum device 210, i.e., setting $K_{ij}$ to zero.

In another example, the quantum annealer 200 can be used to solve problems in which the $K_{ij}$ term is non-zero. For instance, in some implementations, the $K_{ij}$ interaction can be kept on during the annealing step and turned off at the end. For instance, the adiabatic quantum computation can be generalized as follows:

$$H(s)=(1-s)H_B+sH_p+s(1-s)H_D,$$

where $H_B$ is the initial Hamiltonian, $H_p$ is the problem Hamiltonian defined as $H_p=J_{ij}\sigma_z^i\sigma_z^j$, and $H_D$ is the $K_{ij}$ interaction Hamiltonian defined as $H_D=K_{ij}\sigma_x^i\sigma_x^j$. As the system is annealed, it progresses from a first state at s=0 (such that $H(0)=H_B$) to the second final state at s=1 (such that $H(1)=H_p$). Between s=0 and s=1, the interaction Hamiltonian is on.

Figure 3:
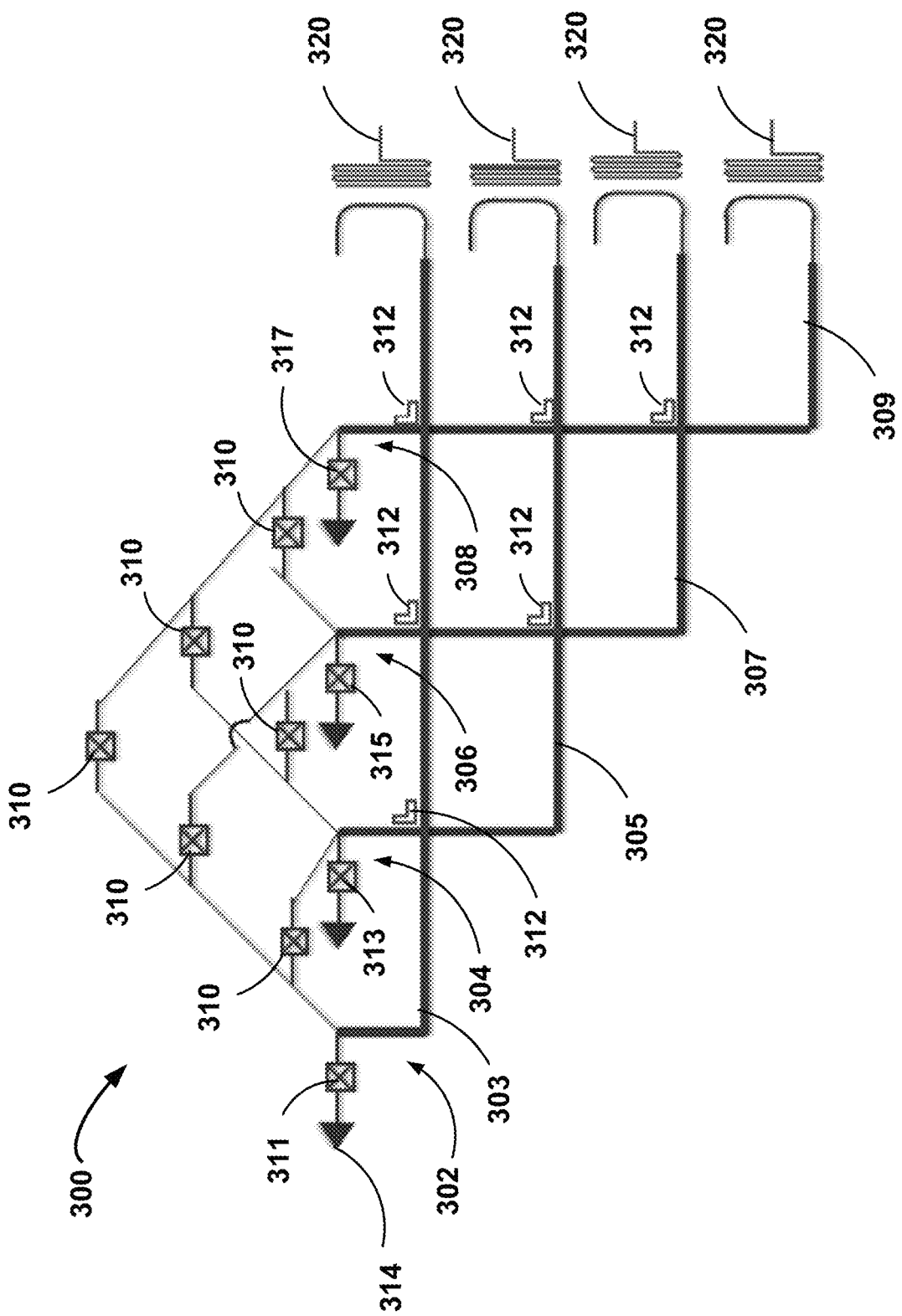
FIG. 3 is a schematic of a quantum annealer that is capable of operating as a fully programmable universal quantum computer.

The quantum annealer design shown in FIGS. 2A-2C can be expanded to include more than 2 qubits, while still providing a fully programmable universal quantum computer. For example, FIG. 3 is a schematic of a quantum annealer 300 having four qubits that is capable of providing a fully programmable universal quantum computer. The components are formed on a dielectric substrate, such as sapphire, as described above. For ease of viewing, the co-planar ground plane is not depicted in FIG. 4, though ground connections 314 are still provided. Similar to the design of the annealer 200, each qubit (302, 304, 306, 308) of quantum annealer 300 includes a quantum device such as a DC-SQUID (311, 313, 315, 317) in electrical contact with a respective thin film superconducting waveguide (303, 305, 307, 309). For the purposes of the illustration shown in FIG. 3, each box containing an embedded cross corresponds to a DC-SQUID, and does not represent a Josephson junction as in FIGS. 2A-2B. The waveguides (303, 305, 307, 309) are designed so that each waveguide crosses over or overlaps a waveguide from another qubit at a coupling region. For instance, as shown in FIG. 3, each waveguide is designed to form a right angle/L-shape to provide the coupling regions.

A coupler element 312 is positioned adjacent to each coupling region/waveguide cross-over so that each qubit is operatively couplable to each other qubit in the annealer 300. For instance, in the example shown in FIG. 3, six coupler elements 312 are provided to ensure full connectivity. In particular, at each cross-over region between two thin film superconducting waveguides from different qubits, a thin film superconducting loop 312 is arranged adjacent to each waveguide, in which a first portion of the loop extends in a first direction along the elongated direction of one of the waveguides and a second portion of the loop extends in a second orthogonal direction along the elongated direction of the other waveguide, with a right angle bend where the waveguides cross. Accordingly, by placing the coupler elements 312 in this manner, each qubit can be coupled to each other qubit during operation of the annealer 300. For instance, qubit 302 can be coupled to each of qubits 304, 306, and 308. Similarly, qubit 304 also can be coupled to each of qubit 306 and 308. And qubit 306 also can be coupled to qubit 308. As explained above, though waveguides 303, 305, 307, 309 are shown as overlapping one another, the waveguides are not in electrical contact at the crossing. Rather, they are separated from one another using a jumper, such as, e.g., a cross-over air-bridge that allows one of the two waveguides to pass over the other at the crossing without coming into contact. The coupler elements 312 are laterally separated from each waveguide by a thin gap (e.g., on the order of a few microns).

While quantum annealer 200 includes a single tuning quantum device 210, an annealer having more than 2 qubits should include as many tuning quantum devices as are sufficient to allow the interactions between each qubit to be tuned. For instance, in the example shown in FIG. 3, the quantum annealer 300 includes six tuning quantum devices 310. Each tuning quantum device 310 includes a SQUID, such as a DC-SQUID, that is in electrical contact with two different qubits. In particular, for each tuning quantum device 310, a first end of the device 310 is in electrical contact with one qubit at a node between the thin film superconducting waveguide and the SQUID of the qubit, whereas a second end of the device is in electrical contact with another different qubit at a different node between the thin film superconducting waveguide and the SQUID of the other qubit. As with the tuning quantum devices 210 in annealer 200, devices 310 can be electrically connected to the qubits using thin film superconductors as wires, in which the capacitance of the wires can be safely ignored at the frequency of operation of the quantum annealer 300 (e.g., about 6 GHz or less). Again, the inductance of wires should be taken into account to avoid reductions in coupling strength between qubits and instabilities/decoherence. The quantum annealer 300 also includes, for each qubit, a corresponding readout device 320 constructed in a similar manner to the readout devices 220.

Embodiments of the digital and quantum subject matter and the digital functional operations and quantum operations described in this specification can be implemented in digital electronic circuitry, suitable quantum circuitry or, more generally, quantum computational systems, in tangibly-embodied digital or quantum computer software or firmware, in digital or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Embodiments of the digital and quantum subject matter described in this specification can be implemented as one or more digital or quantum computer programs, i.e., one or more modules of digital or quantum computer program instructions encoded on a tangible non-transitory storage medium for execution by, or to control the operation of, data processing apparatus. The digital or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital or quantum information, e.g., a machine-generated electrical, optical, or electromagnetic signal, that is generated to encode digital or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. The term "data processing apparatus"

refers to digital or quantum data processing hardware and encompasses all kinds of apparatus, devices, and machines for processing digital or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital or quantum computer program can be deployed to be executed on one digital or one quantum computer or on multiple digital or quantum computers that are located at one site or distributed across multiple sites and interconnected by a digital or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital or quantum computers, operating with one or more digital or quantum processors, as appropriate, executing one or more digital or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital or quantum computers.

For a system of one or more digital or quantum computers to be "configured to" perform particular operations or actions means that the system has installed on it software, firmware, hardware, or a combination of them that in operation cause the system to perform the operations or actions. For one or more digital or quantum computer programs to be configured to perform particular operations or actions means that the one or more programs include instructions that, when executed by digital or quantum data processing apparatus, cause the apparatus to perform the operations or actions. A quantum computer may receive instructions from a digital computer that, when executed by the quantum computing apparatus, cause the apparatus to perform the operations or actions.

Digital or quantum computers suitable for the execution of a digital or quantum computer program can be based on general or special purpose digital or quantum processors or both, or any other kind of central digital or quantum processing unit. Generally, a central digital or quantum processing unit will receive instructions and digital or quantum data from a read-only memory, a random access memory, or quantum systems suitable for transmitting quantum data, e.g. photons, or combinations thereof.

The essential elements of a digital or quantum computer are a central processing unit for performing or executing instructions and one or more memory devices for storing instructions and digital or quantum data. The central processing unit and the memory can be supplemented by, or incorporated in, special purpose logic circuitry or quantum simulators. Generally, a digital or quantum computer will also include, or be operatively coupled to receive digital or quantum data from or transfer digital or quantum data to, or both, one or more mass storage devices for storing digital or quantum data, e.g., magnetic, magneto-optical disks, optical disks, or quantum systems suitable for storing quantum information. However, a digital or quantum computer need not have such devices.

Digital or quantum computer-readable media suitable for storing digital or quantum computer program instructions and digital or quantum data include all forms of non-volatile digital or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital or quantum computer program product that includes instructions that are stored on one or more non-transitory machine-readable storage media, and that are executable on one or more digital or quantum processing devices. The systems described in this specification, or portions of them, can each be implemented as an apparatus, method, or system that may include one or more digital or quantum processing devices and memory to store executable instructions to perform the operations described in this specification.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. Various modifications may be made without departing from the spirit and scope of the invention. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method of operating a quantum computing device, the quantum computing device comprising:
   at least two co-planar waveguide flux qubits, each co-planar waveguide flux qubit comprising a superconducting quantum interference device (SQUID) and an elongated superconductor co-planar waveguide electrically coupled in parallel with the SQUID,
   a coupler element arranged such that the co-planar waveguide of a first co-planar waveguide flux qubit of the at least two co-planar waveguide flux qubits is operatively couplable to the co-planar waveguide of a second co-planar waveguide flux qubit of the at least two co-planar waveguide flux qubits, and
   a tuning quantum device comprising at least one Josephson junction, wherein the tuning quantum device is in electrical contact with the first co-planar waveguide flux qubit and with the second co-planar waveguide flux qubit, the method comprising:
   operating the tuning quantum device to modify a coupling strength between the first co-planar waveguide flux qubit and the second co-planar waveguide flux qubit.

2. The method of claim 1, wherein operating the tuning quantum device comprises applying an external magnetic flux to the tuning quantum device to alter a local flux bias.

3. The method of claim 1, comprising:
   encoding a ground-state of a problem Hamiltonian in the quantum computing device; and
   annealing the quantum computing device into a ground state of a solution Hamiltonian.

4. The method of claim 3, wherein encoding the ground-state of the problem Hamiltonian comprises:
   applying an external flux bias $\Phi_{ex}$ to the quantum computing device;
   applying a first local flux bias $\Psi_a$ to the first co-planar waveguide flux qubit; and
   applying a second local flux bias $\Psi_b$ to the second co-planar waveguide flux qubit.

5. The method of claim 3, wherein encoding the ground-state of the problem Hamiltonian comprises using the tuning quantum device to turn off interactions between the first co-planar waveguide flux qubit and the second co-planar waveguide flux qubit.

6. The method of claim 3, wherein annealing the quantum computing device comprises using the tuning quantum device to turn on coupling between the first co-planar waveguide flux qubit and the second co-planar waveguide flux qubit.

7. The method of claim 3, further comprising measuring a state of the quantum computing device subsequent to annealing the quantum computing device.

8. The method of claim 3, wherein a state of the quantum computing device during operation is represented by:

$$H = \sum_{1}^{N} h_i \sigma_Z^i + \sum_{i,j}^{N} (J_{i,j} \sigma_Z^i \sigma_Z^j + K_{i,j} \sigma_x^i \sigma_x^j),$$

for $i = 1 \ldots N$, $j = 1 \ldots N$, wherein N is the number of co-planar waveguide flux qubits in the quantum computing device, $h_i$ the local bias on co-planar waveguide flux qubit i, $\sigma_z$ and $\sigma_x$ represent the Pauli matrices, and $J_{ij}$ and $K_{ij}$ are the coupling strength between co-planar waveguide flux qubits i and j and are tunable by the tuning quantum device.

* * * * *